US007687015B2

(12) United States Patent
Watanabe et al.

(10) Patent No.: US 7,687,015 B2
(45) Date of Patent: Mar. 30, 2010

(54) METHOD FOR PRODUCING LAMINATED DIELECTRIC

(75) Inventors: Shotaro Watanabe, Yokohama (JP); Yasuko Osaki, Yokohama (JP); Naoyuki Tsuda, Yokohama (JP); Kazunari Watanabe, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 1134 days.

(21) Appl. No.: 11/282,835

(22) Filed: Nov. 21, 2005

(65) Prior Publication Data

US 2006/0075782 A1    Apr. 13, 2006

Related U.S. Application Data

(63) Continuation of application No. PCT/JP2005/007931, filed on Apr. 26, 2005.

(30) Foreign Application Priority Data

May 6, 2004    (JP)    ............................. 2004-137579

(51) Int. Cl.
C04B 35/64    (2006.01)
C03C 14/00    (2006.01)
(52) U.S. Cl. .......................... 264/614; 264/642; 501/32
(58) Field of Classification Search ................. 264/642, 264/614
See application file for complete search history.

(56) References Cited

U.S. PATENT DOCUMENTS

| | | | |
|---|---|---|---|
| 4,127,792 A | 11/1978 | Nakata | |
| 5,290,393 A | 3/1994 | Nakamura | |
| 5,523,589 A | 6/1996 | Edmond et al. | |
| 5,714,006 A | 2/1998 | Kizuki et al. | |
| 6,153,010 A | 11/2000 | Kiyoku et al. | |
| 6,362,515 B2 | 3/2002 | Hayakawa | |
| 6,447,888 B2 * | 9/2002 | Suzuki et al. | 428/210 |
| 6,462,355 B1 | 10/2002 | Linthicum et al. | |
| 6,545,300 B2 | 4/2003 | Gehrke et al. | |
| 6,602,616 B2 * | 8/2003 | Sugimoto et al. | 428/688 |
| 6,699,605 B2 * | 3/2004 | Umayahara et al. | 428/701 |
| 2001/0038655 A1 | 11/2001 | Tanaka et al. | |
| 2003/0118842 A1 * | 6/2003 | Moriya et al. | 428/428 |

FOREIGN PATENT DOCUMENTS

| | | |
|---|---|---|
| JP | 2001-284807 | 10/2001 |
| JP | 2001-284818 | 10/2001 |
| JP | 2002-111228 | 4/2002 |
| JP | 2002-261446 | 9/2002 |
| JP | 2002-368420 | 12/2002 |
| JP | 2003-63855 | 3/2003 |
| JP | 2003-69236 | 3/2003 |
| JP | 2004-26594 | 1/2004 |
| JP | 2004-83373 | 3/2004 |
| JP | 2004-319919 | 11/2004 |

OTHER PUBLICATIONS

JP 2003-069236 A (Furuse et al.) Mar. 7, 2003 (English machine translation of foreign patent already of record on applicant's IDS of Jan. 20, 2006). [online] [retrieved Mar. 10, 2009]. Retrieved from: Japan Patent Office Advanced Industrial Property Network.*
Zheleva et al., *Pendeo-Epitaxy—A New Approach for Lateral Growth of GaN Structures*, MRS Internet Journal of Nitride Semiconductor Research, 1999, Online!, vol. 4S1, No. G3.38, Nov. 30, 1998-Dec. 4, 1998.
Nakamura et al., *InGaN/GaN/AlGaN-Based Laser Diodes Grown on GaN Substrates With a Fundamental Transverse Mode*, Jpn. J. Appl. Phys., vol. 37, Sep. 15, 1998. pp. L1020-L1022.
Marchand et al., *Microstructure of GaN Laterally Overgrown by Metalorganic Chemical Vapor Deposition*, Applied Physics Letters, vol. 73, No. 6, Aug. 10, 1998, pp. 747-749.
Sakai et al., *Transmission Electron Microscopy of Defects in GaN films Formed by Epitaxial Lateral Overgrowth*, vol. 73, No. 45, Jul. 27, 1998, pp. 481-483.
Nakamura et al., *High-Power, Long-Lifetime InGaN/GaN/AlGaN-Based Laser Diodes Grown on Pure GaN Substrates*, Jpn. J. Appl. Phys., vol. 37, Mar. 15, 1998, pp. L309-L312.
Nam et al., *Lateral Epitaxial Overgrowth of GaN Films on $SiO_2$ Areas Via Metalorganic Vapor Phase Epitaxy*, Journal of Electronic Materials, vol. 27, No. 4, 1998, pp. 233-237.
Wu et al., *Growth and Characterization of SiC Films on large-Area Si Wafers by APCVD-Temperature Dependence*, Materials Science Forum, vols. 264-268, 1998, pp. 179-182.
Nam et al., *Lateral Epitaxy of Low Defect Density GaN Layers Via Organometallic Vapor Phase Epitaxy*, Appl. Phys. Lett., vol. 71, No. 18, Nov. 3, 1997, pp. 2638-2640.
U.S. Appl. No. 12/133,038, filed Jun. 4, 2008, Honoda, et al.
U.S. Appl. No. 12/138,062, filed Jun. 12, 2008, Fujimine, et al.

* cited by examiner

*Primary Examiner*—Steven P Griffin
*Assistant Examiner*—Erin Snelting
(74) *Attorney, Agent, or Firm*—Oblon, Spivak, McClelland, Maier & Neustadt, L.L.P.

(57) ABSTRACT

A method for producing a laminated dielectric, which comprises laminating a raw material layer containing a high dielectric constant glass ceramic composition comprising from 30 to 70 mass % of a Ba—Ti compound powder having a Ti/Ba molar ratio of from 3.0 to 5.7 and from 30 to 70 mass % of an alkali free glass powder containing, by mol %, from 15 to 40% of $SiO_2$, from 5 to 37% of $B_2O_3$, from 2 to 15% of $Al_2O_3$, from 1 to 25% of CaO+SrO, from 5 to 25% of BaO and from 25 to 50% of $SiO_2+Al_2O_3$, and a raw material layer containing a low dielectric constant glass ceramic composition comprising from 10 to 70 mass % of a ceramic powder and from 30 to 90 mass % of an alkali free glass powder wherein $SiO_2+Al_2O_3$ is at least 34 mol % and larger by at least 9 mol % than that in the above alkali free glass powder, followed by firing.

27 Claims, No Drawings

METHOD FOR PRODUCING LAMINATED DIELECTRIC

BACKGROUND OF THE INVENTION

1. Field of the Invention

The present invention relates to a method for producing a laminated dielectric, suitable for producing by low temperature firing a laminated dielectric having a low dielectric constant layer and a high dielectric constant layer alternately laminated so that a low dielectric constant layer constitutes the outer most layer, which is suitable for e.g. a substrate for a circuit or an antenna.

2. Discussion of Background

A small size substrate is used as a substrate for e.g. an antenna or a circuit for a small size electronic equipment such as a mobile phone to be used in a high frequency region such as a microwave range.

As such a small size substrate, a laminated dielectric substrate having a low dielectric constant layer, a high dielectric constant layer and a low dielectric constant layer laminated in this order, is known (e.g. JP-A-2001-284807).

The laminated dielectric substrate disclosed in the above publication, is prepared by laminating a glass ceramic composition to form a low dielectric constant layer and a magnesium titanate/glass-forming composition mixture to form a high dielectric constant layer and then cofiring them.

In the inner or on the surface of such a laminated dielectric substrate, a conductor composed mainly of silver or copper is usually formed. In such a case, it is common to apply or fill a silver paste or copper paste to form such a conductor at a desired portion, followed by the cofiring.

The high dielectric constant layer in the laminated dielectric disclosed in the above publication contains Li in each case. However, it is known that an alkali metal such as Li deteriorates the electrical insulating property. Further, in a case where a silver conductor is formed in contact with the high dielectric constant layer containing an alkali metal such as Li, migration of silver to such a layer is likely to take place to further deteriorate the electrical insulating property of the layer.

On the other hand, if cofiring is carried out as mentioned above, the fired object usually shrinks, and if the shrinkage is large, the dimensional precision of the laminated dielectric (the fired body) will deteriorate. However, with the laminated dielectric disclosed in the above publication, no such problem appears to be present. This is considered to be attributable to the fact that the high dielectric constant layer in the laminate is one obtainable by firing a mixture comprising a magnesium titanate and a small amount of a Li-containing glass-forming composition (its content represented by mass percentage being 27% at the maximum). Namely, it is considered that the shrinking behavior during the firing of the mixture having a small content of the Li-containing glass-forming composition is substantially different from the shrinking behavior of a glass ceramic composition (composed mainly of glass) to form a low dielectric constant layer, and the above-mentioned shrinkage is small.

SUMMARY OF THE INVENTION

It is an object of the present invention to provide a method for producing a laminated dielectric, whereby the above-mentioned shrinkage can be made small in the production of a laminated dielectric containing no alkali metal.

The present invention provides a method (first method) for producing a laminated dielectric having a low dielectric constant layer and a high dielectric constant layer alternately laminated in an odd number of layers in total so that a low dielectric constant layer constitutes the outermost layer, which comprises alternately laminating a high dielectric constant raw material layer containing a high dielectric constant glass ceramic composition, to form a high dielectric constant layer having a relative dielectric constant at a frequency of from 1 GHz to 25 GHz (such a relative dielectric constant will be hereinafter referred to as $\in$) of from 16 to 30, when fired, and a low dielectric constant raw material layer containing a low dielectric constant glass ceramic composition, to form a low dielectric constant layer having $\in$ of at least 5, which is smaller by at least 3 than $\in$ of a high dielectric constant layer adjacent thereto, when fired, in an odd number of layers in total so that a low dielectric constant raw material layer constitutes the outermost layer, followed by firing, wherein:

the high dielectric constant glass ceramic composition consists essentially of, as represented by mass percentage, from 30 to 70% of a ceramic powder and from 30 to 70% of a glass powder containing $SiO_2$ and $Al_2O_3$ in an amount of $SiO_2+Al_2O_3$ being from 25 to 50 mol % and further containing at least one of $B_2O_3$, BaO and ZnO and not containing lead and alkali metals, and is one which precipitates crystals when fired at a temperature of from 850 to 900° C.;

the low dielectric constant glass ceramic composition consists essentially of, as represented by mass percentage, from 10 to 70% of a ceramic powder and from 30 to 90% of a glass powder containing $SiO_2$ and $Al_2O_3$ in an amount of $SiO_2+Al_2O_3$ being at least 34 mol % and not containing lead and alkali metals, and is one which precipitates crystals when fired at a temperature of from 850 to 900° C.;

the difference obtained by subtracting from the amount of $SiO_2+Al_2O_3$ in the glass powder in the low dielectric constant glass ceramic composition of the low dielectric constant raw material layer the amount of $SiO_2+Al_2O_3$ in the glass powder in the high dielectric constant glass ceramic composition of the high dielectric constant raw material layer adjacent to the low dielectric constant raw material layer, is at least 9 mol %; and the difference obtained by subtracting from the amount of $B_2O_3+BaO+ZnO$ in the glass powder in the high dielectric constant glass ceramic composition of the high dielectric constant raw material layer the amount of $B_2O_3+BaO+ZnO$ in the glass powder in the low dielectric constant glass ceramic composition of the low dielectric constant raw material layer adjacent to the high dielectric constant raw material layer, is at least 30 mol %.

Further, the present invention provides a method (second method) for producing a laminated dielectric having a low dielectric constant layer and a high dielectric constant layer alternately laminated in an odd number of layers in total so that a low dielectric constant layer constitutes the outermost layer, which comprises alternately laminating a high dielectric constant raw material layer containing a high dielectric constant glass ceramic composition, to form a high dielectric constant layer having $\in$ of from 16 to 30, when fired, and a low dielectric constant raw material layer containing a low dielectric constant glass ceramic composition, to form a low dielectric constant layer having $\in$ of at least 5, which is smaller by at least 3 than $\in$ of a high dielectric constant layer adjacent thereto, when fired, in an odd number of layers in total so that a low dielectric constant raw material layer constitutes the outermost layer, followed by firing, wherein:

the high dielectric constant glass ceramic composition consists essentially of, as represented by mass percentage, from 30 to 70% of a Ba—Ti compound powder containing Ba and Ti in a Ti/Ba molar ratio of from 3.0 to 5.7, and from 30 to 70% of a glass powder consisting essentially of, as represented by mol % of the following oxides, from 15 to 40% of $SiO_2$, from 5 to 37% of $B_2O_3$, from 2 to 15% of $Al_2O_3$, from 1 to 25% of CaO+SrO, from 5 to 25% of BaO, from 0 to 35% of ZnO and from 0 to 10% of $TiO_2+ZrO_2+SnO_2$, $SiO_2+Al_2O_3$ being from 25 to 50 mol %, $B_2O_3+ZnO$ being from 15 to 45 mol % and not containing lead and alkali metals (hereinafter referred to as glass powder A for high dielectric constant);

the low dielectric constant glass ceramic composition consists essentially of, as represented by mass percentage, from 10 to 70% of a ceramic powder and from 30 to 90% of a glass powder containing $SiO_2$ and $Al_2O_3$ in an amount of $SiO_2+Al_2O_3$ being at least 34 mol %, not containing $B_2O_3$ or containing $B_2O_3$ within a range of at most 22 mol % and not containing lead and alkali metals (hereinafter referred to as glass powder for low dielectric constant); and the difference obtained by subtracting from the amount of $SiO_2+Al_2O_3$ in the glass powder in the low dielectric constant glass ceramic composition of the low dielectric constant raw material layer the amount of $SiO_2+Al_2O_3$ in the glass powder in the high dielectric constant glass ceramic composition of the high dielectric constant raw material layer adjacent to the low dielectric constant raw material layer, is at least 9 mol %.

Still further, the present invention provides a method (third method) for producing a laminated dielectric having a low dielectric constant layer and a high dielectric constant layer alternately laminated in an odd number of layers in total so that a low dielectric constant layer constitutes the outermost layer, which comprises alternately laminating a high dielectric constant raw material layer containing a high dielectric constant glass ceramic composition, to form a high dielectric constant layer having ∈ of from 16 to 30, when fired, and a low dielectric constant raw material layer containing a low dielectric constant glass ceramic composition, to form a low dielectric constant layer having ∈ of at least 5, which is smaller by at least 3 than ∈ of a high dielectric constant layer adjacent thereto, when fired, in an odd number of layers in total so that a low dielectric constant raw material layer constitutes the outermost layer, followed by firing, wherein:

the high dielectric constant glass ceramic composition consists essentially of, as represented by mass percentage, from 30 to 70% of a Ba—Ti compound powder containing Ba and Ti in a Ti/Ba molar ratio of from 3.0 to 5.7, and from 30 to 70% of a glass powder consisting essentially of, as represented by mol % of the following oxides, from 15 to 40% of $SiO_2$, from 5 to 37% of $B_2O_3$, from 2 to 15% of $Al_2O_3$, from 1 to 25% of MgO+CaO+SrO, from 0 to 7% of MgO, from 5 to 25% of BaO, from 0 to 35% of ZnO and from 0 to 10% of $TiO_2+ZrO_2+SnO_2$, $SiO_2+Al_2O_3$ being from 25 to 50 mol %, $B_2O_3+ZnO$ being from 15 to 45 mol % and not containing lead and alkali metals (hereinafter referred to as glass powder B for high dielectric constant);

the low dielectric constant glass ceramic composition consists essentially of, as represented by mass percentage, from 10 to 70% of a ceramic powder and from 30 to 90% of a glass powder containing $SiO_2$ and $Al_2O_3$ in an amount of $SiO_2+Al_2O_3$ being at least 34 mol %, not containing $B_2O_3$ or containing $B_2O_3$ within a range of at most 22 mol % and not containing lead and alkali metals; and the difference obtained by subtracting from the amount of $SiO_2+Al_2O_3$ in the glass powder in the low dielectric constant glass ceramic composition of the low dielectric constant raw material layer the amount of $SiO_2+Al_2O_3$ in the glass powder in the high dielectric constant glass ceramic composition of the high dielectric constant raw material layer adjacent to the low dielectric constant raw material layer, is at least 9 mol %.

The present inventors have found high dielectric constant glass ceramic compositions (high dielectric constant glass ceramic compositions in the above second and third methods) capable of presenting high dielectric constant layers containing no alkali metal, and have conducted various researches for a glass ceramic composition to form a low dielectric constant layer with an aim to find out a method for producing a laminated dielectric capable of solving the above problems by using such a high dielectric constant glass ceramic composition.

As a result, it has been found that in order to reduce the shrinkage during the firing, the difference between the softening point (Ts) of the glass powder in the low dielectric constant glass ceramic composition and Ts of the glass powder for high dielectric constant may be made to be at least 70° C., and as a result, the present invention has been accomplished. Further, it has also been found that if the difference in Ts is less than 110° C., even if it is at least 70° C., the above shrinkage may sometimes become large, and thus, such a difference is preferably at least 110° C., more preferably at least 130° C. Further, in such a case, it is highly possible that precipitation of crystals in the high dielectric constant layer is less, which is considered to be attributable to the increase in the shrinkage.

According to the present invention, it is possible to produce a laminated dielectric containing no alkali metal in the high dielectric constant layer while the shrinkage during the firing can be made small.

Further, according to one embodiment of the present invention, it is possible to obtain a laminated dielectric having high strength.

Further, according to another embodiment of the present invention, it is possible to obtain a glass ceramic green sheet for forming a high dielectric constant layer having high homogeneity.

By using the laminated dielectric of the present invention, a substrate for ultrawide band (UWB) antenna element may, for example, be small-sized. Further, by forming a low noise amplifier circuit in a low dielectric constant layer while the overall effective dielectric constant is made high, it is possible to obtain a small-sized antenna module of antenna/low noise amplifier integration type. Such a small-sized antenna module may be applied to e.g. satellite communication so-called SDARS.

DETAILED DESCRIPTION OF THE PREFERRED EMBODIMENTS

The laminated dielectric produced by the method for producing a laminated dielectric of the present invention (hereinafter referred to as the laminated dielectric of the present invention) is suitable for e.g. a substrate for UWB antenna element.

The substrate for UWB antenna is typically one having a three-layered structure wherein the upper and lower low dielectric constant layers have ∈ or the relative dielectric constant at e.g. 6 GHz, 20 GHz or 25 GHz, of from 5 to 10 and a thickness of from 0.2 to 0.5 mm, and the center high dielectric constant layer has ∈ or the above relative dielectric constant, of from 16 to 30 and a thickness of from 0.4 to 0.8 and wherein a radiant conductor is formed at the center in the thickness direction of the high dielectric constant layer. More typically, ∈ or the above relative dielectric constant of the low dielectric constant layers is from 5 to 9, and ∈ or the above relative dielectric constant of the high dielectric constant layer is from 18 to 24. Further, the frequency range of UWB is typically from about 3 GHz to about 11 GHz, and in the present invention, the relative dielectric constant and the after-mentioned dielectric loss are ones at room temperature, typically at 20° C. or 25° C.

∈ of the low dielectric constant layer is typically smaller by at least 10 than ∈ of the adjacent high dielectric constant layer.

The frequency dependency of ∈ of the high dielectric constant layer in the laminated dielectric of the present invention is usually small and typically 3 or smaller at from 1 GHz to 25 GHz.

The dielectric loss at a frequency of from 1 GHz to 25 GHz (hereinafter this dielectric loss is referred to as tan δ) i.e. the dielectric loss at e.g. 6 GHz, 20 GHz or 25 GHz, of the high dielectric constant layer and the low dielectric constant layer, is preferably at most 0.0050, more preferably at most 0.0040 and typically at least 0.0010.

The thickness of each layer is typically from 0.2 to 0.8 mm, and the thicknesses of layers symmetrically located from the center layer are preferably equal to each other. For example, in the case of seven layers, the thicknesses of the first and seventh layer, the second and sixth layers, and the third and fifth layers, are preferably equal to each other, respectively. Otherwise, the strength of the laminated dielectric may sometimes tend to be low.

The average linear expansion coefficient (α) within a range of from 50 to 350° C. of the high dielectric constant layer is typically from $70 \times 10^{-7}$ to $90 \times 10^{-7}/°$ C.

The absolute value of the difference in α between the adjacent high dielectric constant layer and low dielectric constant layer is preferably at most $20 \times 10^{-7}/°$ C. If it exceeds $20 \times 10^{-7}/°$ C., cracks are likely to form in the laminated dielectric. It is more preferably at most $15 \times 10^{-7}/°$ C., particularly preferably at most $10 \times 10^{-7}/°$ C.

In the method for producing a laminated dielectric of the present invention, a green sheet method is usually employed. The present invention will be described hereinafter with reference to a case where the green sheet method is employed, but it should be understood that the present invention is by no means restricted thereto.

The high dielectric constant raw material layer is made of one or plural green sheets containing the high dielectric constant glass ceramic composition (hereinafter referred to as the high dielectric constant composition), and such a green sheet is prepared, for example, as follows. Namely, the high dielectric constant composition is mixed with a resin such as a polyvinyl butyral or an acrylic resin, a solvent such as toluene, xylene or butanol and, if necessary, a plasticizer such as dibutyl phthalate, dioctyl phthalate, triethylene glycol or polyethylene glycol, or a dispersant to obtain a slurry. Then, the slurry is formed into a sheet on a film of e.g. polyethylene terephthalate (PET) by e.g. a doctor blade method. One thus formed into a sheet, is dried to remove the solvent thereby to obtain a green sheet.

The low dielectric constant raw material layer is made of one or plural green sheets containing the low dielectric constant glass ceramic composition (hereinafter referred to as the low dielectric constant composition), and such a green sheet may be prepared in the same manner as the green sheet containing the high dielectric constant composition.

A high dielectric constant composition-containing green sheet or one having a plurality of such green sheets laminated, i.e. a high dielectric constant raw material layer, is overlaid on a low dielectric constant composition-containing green sheet or one having a plurality of such green sheets laminated, i.e. a low dielectric constant raw material layer, and in such a manner, the two raw material layers are alternately laminated in an odd number in total so that a low dielectric constant raw material layer constitutes the top layer. Then, this laminated assembly is heated and pressed at from 80 to 120° C. to obtain an object to be fired, which is then fired to obtain a laminated dielectric.

The firing is usually carried out by maintaining the object at a temperature of from 800 to 900° C. for from 5 to 120 minutes. More typically, the firing temperature is from 850 to 880° C.

On a green sheet, a wiring conductor or the like is preliminarily formed by e.g. screen printing by means of e.g. a silver paste, as the case requires.

Now, the composition of the high dielectric constant composition in the first method will be described by mass percentage representation.

The ceramic powder is essential as a component to increase the strength of the fired body (the high dielectric constant layer) or to increase ∈ of the fired body. As such a ceramic powder, a powder of ceramics such as the after-mentioned Ba—Ti compound, $TiO_2$ crystals, a $(Ca,Mg)TiO_3$ solid solution, $BaZrO_3$ crystals, $BaWO_4$ crystals, a $Ba(Zr,Zn,Ta)O_3$ solid solution or a $Ba(Ti,Zr)O_3$ solid solution, may, for example, be mentioned.

If the ceramic powder is less than 30%, ∈ of the fired body is likely to be small, and it is preferably at least 35%, more preferably at least 45%, and if it exceeds 70%, a dense fired body tends to be hardly obtainable, and it is preferably at most 65%.

The above-mentioned glass powder is essential as a component to increase the densification of the fired body. If the glass powder is less than 30%, a dense fired body tends to be hardly obtainable, and it is preferably at least 35%. If it exceeds 70%, ∈ tends to be small, or tan δ tends to be large, and it is preferably at most 65%, more preferably at most 55%.

If the total content of $SiO_2$ and $Al_2O_3$ in this glass powder is less than 25 mol %, the chemical stability of the glass tends to be inadequate, and the total content is typically at least 32 mol %. If it exceeds 50 mol %, a dense fired body tends to be hardly obtainable when firing is carried out at a temperature of at most 900° C., and it is typically at most 44 mol %.

Further, the above glass powder contains at least one of $B_2O_3$, BaO or ZnO, as a component to lower Ts.

$D_{50}$ of this glass powder is preferably from 0.5 to 20 μm. If $D_{50}$ is less than 0.5 μm, it is likely, for example, that it tends to be difficult to uniformly disperse the glass powder in the green sheet, and it is more preferably at least 1 μm, particularly preferably at least 2 μm. If exceeds 20 μm, a dense fired body tends to be hardly obtainable, and it is more preferably at most 15 μm, further preferably at most 7 μm, particularly preferably at most 5 μm.

Ts of this glass powder is preferably at most 800° C. If Ts exceeds 800° C., a dense fired body may not be obtained when firing is carried out at a temperature of at most 900° C., or in order to obtain such a dense fired body, the content of such a glass powder will have to be increased, and consequently, ∈ of the fired body is likely to be small, or tans is likely to be large. Ts is more preferably at most 780° C. In a case where it is desired to obtain a dense fired body even when firing is carried out at a temperature of at most 880° C., Ts is preferably at most 770° C., more preferably at most 760° C.

The glass transition point (Tg) of this glass powder is typically from 550 to 650° C.

In order to increase the strength of the fired body, this high dielectric constant composition is one which precipitates crystals when fired at a temperature of from 850 to 900° C. Usually, the crystals will be precipitated in the above-mentioned glass powder.

The high dielectric constant composition in the first method consists essentially of the above-mentioned components, but may contain other components within a range not to impair the purpose of the present invention. The contents of such other components are preferably at most 20%, more preferably at most 10%, in total.

For example, it may contain, as such other components, at least one type of crystal powder selected from the group consisting of MgO, $MgTiO_3$, $CaTiO_3$, $SrTiO_3$ and $TiO_2$, for the purpose of e.g. increasing $\in$. In such a case, their total content is preferably from 0.1 to 20%, typically from 0.5 to 10%. It is particularly preferred to incorporate a $TiO_2$ crystal powder when it is desired to increase the densification of a fired body or to reduce tan δ.

In a case where it is desired, for example, to increase the homogeneity of the green sheet containing the high dielectric constant composition, it is preferred to use only a $TiO_2$ crystal powder as such other component. For example, if a crystal powder of e.g. MgO, $MgTiO_3$, $CaTiO_3$ or $SiTiO_3$ is incorporated in addition to the $TiO_2$ crystal powder, lumps tend to be formed in the green sheet.

Now, the composition of the high dielectric constant composition in the second method will be described by mass percentage representation.

The Ba—Ti compound powder containing Ba and Ti in a Ti/Ba molar ratio of from 3.0 to 5.7, typically from 3.5 to 5.0 (hereinafter this Ba—Ti compound will be referred to simply as the Ba—Ti compound), is essential as a component to increase E or reduce tan δ of the fired body (the high dielectric constant layer).

The Ba—Ti compound is not limited to crystals and may be a solid solution. For example, $BaTi_4O_9$ crystals, $BaTi_5O_{11}$ crystals, $Ba_2Ti_9O_{20}$ crystals, $BaSmTi_5O_{14}$ crystals or a $Ba(BaO,Sm_2O_3)4TiO_2$ solid solution, may be mentioned.

The Ba—Ti compound preferably contains $BaTi_4O_9$ crystals having a characteristic such that the relative dielectric constant is large and the dielectric loss is small, in the high frequency region.

A powder containing the $BaTi_4O_9$ crystals may, for example, be prepared as follows. Namely, a powder mixture comprising a barium carbonate powder and a titanium oxide powder in a Ti/Ba molar ratio within a range of from 3.5 to 4.5, is pulverized by e.g. a ball mill to obtain a pulverized powder mixture. The obtained pulverized powder mixture is held at from 1,000 to 1,500° C. to react the barium carbonate powder and the titanium oxide powder. The holding temperature is preferably from 1,050 to 1,250° C.

In the X-ray diffraction pattern of the powder thus obtained (hereinafter referred to as the BT powder), a diffraction peak pattern of $BaTi_4O_9$ crystals is observed.

Further, with the BT powder, a diffraction peak pattern of crystals other than $BaTi_4O_9$ crystals, such as $Ba_2Ti_9O_{20}$ crystals, $BaTi_5O_{11}$ crystals or $TiO_2$ crystals, may sometimes be observed.

$D_{50}$ of the Ba—Ti compound powder is preferably from 0.5 to 15 μm. If $D_{50}$ exceeds 15 μm, a dense fired body tends to be hardly obtainable, and it is preferably at most 10 μm, particularly preferably at most 5 μm.

If the content of the Ba—Ti compound powder is less then 30%, $\in$ of the fired body tends to be small, and it is preferably at least 35%, more preferably at least 45%. If it exceeds 70%, a dense fired body tends to be hardly obtainable, and it is preferably at most 65%.

The glass powder A for high dielectric constant is essential as a component to increase the densification of the fired body. If its content is less than 30%, a dense fired body tends to be hardly obtainable, and it is preferably at least 35%. If it exceeds 70%, $\in$ tends to be small, or tan δ tends to be large, and it is preferably at most 65%, more preferably at most 55%.

$D_{50}$ of the glass powder A for high dielectric constant is preferably from 0.5 to 20 μm. If $D_{50}$ is less than 0.5 μm, it tends to be difficult to uniformly disperse the glass powder in the green sheet, and it is more preferably at least 1 μm, particularly preferably at least 2 μm. If it exceeds 20 μm, a dense fired body tends to be hardly obtainable, and it is preferably at most 15 μm, further preferably at most 7 μm, particularly preferably at most 5 μm.

Ts of the glass powder A for high dielectric constant is preferably at most 800° C. If Ts exceeds 800° C., a dense fired body may not be obtained when firing is carried out at a temperature of at most 900° C., or the content of the glass powder is required to be increased in order to obtain a dense fired body, whereby $\in$ of the fired body tends to be small, or tan δ tends to be large. Ts is more preferably at most 780° C. In a case where it is desired to obtain a dense fired body even by firing at a temperature of at most 880° C., Ts is preferably at most 770° C., more preferably at most 760° C.

Tg of the glass powder A for high dielectric constant is typically from 550 to 650° C.

In a fired body obtained by firing the glass powder A for high dielectric constant, typically in a fired body obtained by firing it at a temperature of from 850 to 900° C., e.g. at 860° C. or 880° C., it is preferred that celsian crystals or hexacelsian crystals are precipitated. If the fired body is not in such a state, the strength of the fired body is likely to be low, or tan δ'of the fired body is likely to be large.

Now, the composition of the glass powder A for high dielectric constant will be described, wherein mol % will be represented simply by %.

$SiO_2$ is a network former for the glass and is essential. If $SiO_2$ is less then 15%, vitrification tends to be difficult, and it is preferably at least 20%, more preferably at least 30%. If it exceeds 40%, Ts tends to be high, whereby firing at a temperature of at most 900° C. tends to be difficult, or $\in$ of the fired body tends to be small, and it is preferably at most 39%, more preferably at most 36%, particularly preferably at most 35%.

$B_2O_3$ has an effect to stabilize the glass or to lower Ts and is essential. If $B_2O_3$ is less than 5%, the above effect tends to be small, and it is preferably at least 11%, more preferably at least 15%. If it exceeds 37%, the chemical stability of the glass is likely to deteriorate, and it is preferably at most 35%, more preferably at most 28%, particularly preferably at most 22%.

$Al_2O_3$ has an effect to stabilize the glass or to increase the chemical durability and is essential. If $Al_2O_3$ is less than 2%, the above effect tends to be small, and it is preferably at least 4%, more preferably at least 6%. If it exceeds 15%, Ts tends to be high, and it is preferably at most 12%, more preferably at most 8%.

If the total content of $SiO_2$ and $Al_2O_3$ is less than 25%, the chemical stability of the glass tends to be inadequate, and the total content is typically at least 32%. If the total content exceeds 50%, a dense fired body tends to be hardly obtainable when firing is carried out at a temperature of at most 900° C., and it is typically at most 44%.

CaO and SrO have an effect to stabilize the glass or to lower tan δ as compared with BaO, and at least one of them is required to be incorporated. If the total content of CaO and SrO is less than 1%, the above effect tends to be small, and it is preferably at least 5%, more preferably at least 6%. If the total content exceeds 25%, the glass rather tends to be unstable, or ∈ tends to be small, and it is preferably at most 20%, more preferably at most 17%, typically at most 10%.

CaO is contained preferably in an amount of at least 5%.

In a case where SrO is contained, the content is preferably at least 1%.

BaO is essential as a component for the purpose of retaining the Ba—Ti compound in the fired body. If BaO is less than 5%, the Ba—Ti compound powder tends to react with the glass components during the firing and the Ba—Ti compound tends to be hardly retained in the fired body, and ∈ of the fired body tends to be small, or tan δ tends to be large. BaO is preferably at least 7%, more preferably at least 10%, typically at least 13%. If BaO exceeds 25%, the glass tends to be unstable, or tan δ tends to be large, and it is preferably at most 20%, more preferably at most 18%.

ZnO is not essential, but may be incorporated up to 35% in order to lower Ts or to stabilize the glass. If ZnO exceeds 35%, the chemical durability, particularly the acid resistance, tends to deteriorate, or the glass rather tends to be unstable, and it is preferably at most 25%, typically at most 20%. In a case where ZnO is incorporated, its content is preferably at least 2%, more preferably at least 6%, typically at least 11%.

If the total content of $B_2O_3$ and ZnO is less than 15%, the glass tends to be unstable, or Ts tends to be high, and the total content is preferably at least 25%. If it exceeds 45%, the chemical durability tends to deteriorate, and it is preferably at most 40%, more preferably at most 35%.

Each of $TiO_2$, $ZrO_2$ and $SnO_2$ is not essential, but they may be incorporated up to 10% in total in order to increase ∈ or to increase the chemical durability. If such a total content exceeds 10%, the crystallization speed during the firing tends to be high, whereby sintering tends to be difficult, and densification of the fired body tends to be low, and it is preferably at most 5%.

The glass for the glass powder A for high dielectric constant consists essentially of the above-mentioned components, but may further contain other components in order to e.g. lower Ts or color the glass within a range not to impair the purpose of the present invention. In a case where such other components are incorporated, the total content of such components is preferably at most 10%. If such a total content exceeds 10%, the glass tends to be unstable, and it is more preferably less than 5%.

As such other components, MgO, $P_2O_5$, $Y_2O_3$, $Ga_2O_3$, $In_2O_3$, $Ta_2O_5$, $Nb_2O_5$, $CeO_2$, $La_2O_3$, $Sm_2O_3$, $MoO_3$, $WO_3$, $Fe_2O_3$, MnO, CuO, CoO and $Cr_2O_3$ may, for example, be mentioned.

Further, it is preferred not to contain alkali metal oxides such as $Li_2O$, $Na_2O$ and $K_2O$, since the electrical insulating property is likely to be thereby deteriorated, and not to contain PbO.

The high dielectric constant composition in the second method consists essentially of the above-described components, but may contain other components within a range not to impair the purpose of the present invention. The total content of such other components is preferably at most 20%, more preferably at most 10%.

For example, the composition may contain, as such other components, at least one type of crystal powder selected from the group consisting of MgO, $MgTiO_3$, $CaTiO_3$, $SrTiO_3$ and $TiO_2$, for the purpose of e.g. increasing ∈. In such a case, their total content is preferably from 0.1 to 20%, typically from 0.5 to 10%. It is preferred to incorporate a $TiO_2$ crystal powder, particularly when it is desired to increase the densification of the fired body or to reduce tan δ.

In a case where it is desired, for example, to increase the homogeneity of the green sheet containing a high dielectric constant composition, it is preferred to incorporate only a $TiO_2$ crystal powder as such other component. For example, if, in addition to the $TiO_2$ crystal powder, a crystal powder of e.g. MgO, $MgTiO_3$, $CaTiO_3$ or $SrTiO_3$ is incorporated, lumps are likely to be formed in the green sheet.

Further, this high dielectric constant composition is preferably one which precipitates crystals when fired at a temperature of from 850 to 900° C., like the high dielectric constant composition in the first method.

The high dielectric constant glass ceramic composition in the third method is different from the composition in the second method only in the composition in the glass powder. Now, the composition of the glass powder in the high dielectric constant glass ceramic composition in the third method i.e. the glass powder B for high dielectric constant, will be described, wherein mol % will be represented simply by %, and further description will be made only with respect to portions which are different from ones in the high dielectric constant glass ceramic composition in the second method.

$SiO_2$ is a network former for the glass and is essential. If $SiO_2$ is less than 15%, vitrification tends to be difficult, and it is preferably at least 20%, more preferably at least 30%. If it exceeds 40%, Ts tends to be high, whereby firing at a temperature of at most 900° C. tends to be difficult, or ∈ of the fired body tends to be small, and it is preferably at most 39%, more preferably at most 36%, particularly preferably at most 35%.

$B_2O_3$ has an effect to stabilize the glass or to lower Ts and is essential. If $B_2O_3$ is less than 5%, such an effect is small, and it is preferably at least 11%, more preferably at least 15%. If it exceeds 37%, the chemical stability of the glass is likely to deteriorate, and it is preferably at most 35%, more preferably at most 22%, particularly preferably at most 20%.

$Al_2O_3$ has an effect to stabilize the glass or to increase the chemical durability and is essential. If $Al_2O_3$ is less than 2%, such an effect is small, and it is preferably at least 4%, more preferably at least 6%. If it exceeds 15%, Ts tends to be high, and it is preferably at most 12%, more preferably at most 8%.

If the total content of $SiO_2$ and $Al_2O_3$ is less than 25%, the chemical stability of the glass tends to be inadequate, and the total content is typically at least 32%. If the total content exceeds 50%, a dense fired body tends to be hardly obtainable when firing is carried out at a temperature of at most 900° C., and it is typically at most 44%.

MgO, CaO and SrO have an effect to stabilize the glass or to lower tan δ as compared with BaO, and at least one of them is required to be incorporated. If the total content of MgO, CaO and SrO is less than 1%, such an effect is small, and it is preferably at least 5%, more preferably at least 6%. If the total content exceeds 25%, the glass rather tends to be unstable, or ∈ tends to be small, and it is preferably at most 20%, more preferably at most 17%, typically at most 10%.

In a case where MgO is incorporated, its content is at least 1%, and if it exceeds 7%, the Ba—Ti compound powder is likely to react with the glass components during the firing, whereby the Ba—Ti compound tends to be hardly retained in the fired body, whereby ∈ of the fired body tends to be small, or tans tend δ to be large, and it is typically at most 6%.

CaO is contained preferably in an amount of at least 5%.

In a case where SrO is incorporated, its content is preferably at least 1%.

BaO is essential as a component incorporated for the purpose of retaining the Ba—Ti compound in the fired body. If BaO is less than 5%, the Ba—Ti compound powder is likely to react with glass components during the firing, whereby the Ba—Ti compound tends to be hardly retained, and ∈ of the fired body tends to be small, or tan δ tends to be large. BaO is preferably at least 7%, more preferably at least 10%, typically at least 13%. If BaO exceeds 25%, the glass tends to be unstable, or tan δ tends to be large, and it is preferably at most 20%, more preferably at most 18%.

ZnO is not essential, but may be incorporated up to 35% in order to lower Ts or to stabilize the glass. If ZnO exceeds 35%, the chemical durability, particularly the acid resistance, tends to deteriorate, or the glass rather tends to be unstable, and it is preferably at most 25%, typically at most 20%. In a case where ZnO is incorporated, its content is preferably at least 2%, more preferably at least 6%, typically at least 11%.

If the total content of $B_2O_3$ and ZnO is less than 15%, the glass tends to be unstable, or Ts tends to be high, and it is preferably at least 25%. If the total content exceeds 45%, the chemical durability tends to deteriorate, and it is preferably at most 40%, more preferably at most 35%.

Each of $TiO_2$, $ZrO_2$ and $SnO_2$ is not essential, but they may be incorporated up to 10% in total in order to increase ∈ or to increase the chemical durability. If such a total content exceeds 10%, the crystallization speed during the firing tends to be high, whereby sintering tends to be difficult, and densification of the fired body is likely to be low.

In a case where it is desired to facilitate precipitation of crystals during the firing, it is preferred to incorporate $TiO_2$. In such a case, the $TiO_2$ content is preferably at least 2%, typically at least 4%.

It is preferred that $SiO_2$ is from 25 to 35%, $B_2O_3$ from 5 to 22%, $Al_2O_3$ from 2 to 10%, MgO from 0 to 6%, CaO from 0 to 10%, SrO from 0 to 10%, BaO from 7 to 22%, ZnO from 0 to 20%, $TiO_2$ from 2 to 10%, $ZrO_2$ from 0 to 8%, and $SnO_2$ from 0 to 2%.

The glass for the glass powder B for high dielectric constant consists essentially of the above-described components, but may contain other components in order to e.g. further lower Ts or color the glass within a range not to impair the purpose of the present invention. In a case where the glass contains such other components, their total content is preferably at most 10%. If such a total content exceeds 10%, the glass tends to be unstable, and it is more preferably less than 5%. As such other components, $P_2O_5$, $Y_2O_3$, $Ga_2O_3$, $In_2O_3$, $Ta_2O_5$, $Nb_2O_5$, $CeO_2$, $La_2O_3$, $Sm_2O_3$, $MoO_3$, $WO_3$, $Fe_2O_3$, MnO, CuO, CoO and $Cr_2O_3$ may, for example, be mentioned.

Further, it is preferred not to contain alkali metal oxides such as $Li_2O$, $Na_2O$ and $K_2O$, since the electrical insulating property is likely to be thereby deteriorated, and not to contain PbO.

The high dielectric constant composition in the third method consists essentially of the glass powder B for high dielectric constant and the Ba—Ti compound, but may contain other components within a range not to impair the purpose of the present invention. The total content of such other components is preferably at most 20%, more preferably at most 10%.

As such other components, a $TiO_2$ crystal powder may, for example, be mentioned. Namely, it is preferred to incorporate a $TiO_2$ crystal powder, in a case where it is desired to increase the densification of the fired body or to reduce tan δ.

In a case where it is desired to increase the homogeneity of the green sheet containing a high dielectric constant composition, it is preferred to incorporate only a $TiO_2$ crystal powder as such other component. For example, if in addition to the $TiO_2$ crystal powder, a crystal powder of e.g. MgO, $MgTiO_3$, $CaTiO_3$ or $SrTiO_3$ is incorporated, lumps are likely to be formed in the green sheet.

Further, the high dielectric constant composition in the third method is preferably one which precipitates barium alminosilicate crystals such as celsian when fired at a temperature of from 850 to 900° C. Namely, if the precipitated crystals are barium alminosilicate crystals, tan δ of the crystals is small, and the Ba content in the glass decreases due to the precipitation of such crystals, whereby it is possible to reduce tan δ of the fired body.

Now, the composition of the low dielectric constant composition in the first method will be described by mass percentage representation.

The above-mentioned glass powder is essential as a component to increase the densification of the fired body.

If its content is less than 30%, the dense fired body tends to be hardly obtainable, and it is preferably at least 40%, more preferably at least 50%, typically at least 60%. If it exceeds 90%, the strength of the fired body tends to deteriorate, and it is preferably at most 85%, more preferably at most 80%.

$D_{50}$ of this glass powder is preferably from 0.5 to 20 μm. If $D_{50}$ is less than 0.5 μm, for example, it tends to be difficult to uniformly disperse the glass powder in the green sheet, and it is more preferably at least 1 μm, particularly preferably at least 2 μm. If it exceeds 20 μm, a dense fired body tends to be hardly obtainable, and it is more preferably at most 15 μm, further preferably at most 7 μm, particularly preferably at most 5 μm.

Ts of this glass powder is preferably higher by at least 110° C. than Ts of the glass powder in the above-described high dielectric constant composition.

Ts of this glass powder is preferably at most 910° C. If Ts exceeds 910° C., a dense fired body may not be obtained when firing is carried out at a temperature of at most 900° C., and it is typically at least 800° C.

Tg of this glass powder is typically from 650 to 750° C.

In a fired body obtained by firing this glass powder, typically in a fired body obtained by firing at a temperature of from 850 to 900° C., e.g. at 860° C., 880° C. or 900° C., crystals are preferably precipitated. Otherwise, the strength of the fired body tends to be low or tan δ of the fired body is likely to be large.

The ceramic powder as another essential component of the low dielectric constant composition, is essential as a component to increase the strength of the fired body or to adjust α of the fired body e.g. to reduce the difference from α of the adjacent high dielectric constant layer.

If the content of the ceramic powder is less than 10%, the strength of fired body tends to be low, and it is typically at least 15%. If it exceeds 70%, a dense fired body tends to be hardly obtainable, and it is typically at most 45%.

$D_{50}$ of the ceramic powder is preferably from 1 to 12 μm. If $D_{50}$ is less than 1 μm, for example, it tends to be difficult to uniformly disperse it in the green sheet, and it is more preferably at least 1.5 μm. If it exceeds 12 μm, a dense fired body tends to be hardly obtainable, and it is more preferably at most 5 μm, particularly preferably at most 3.5 μm.

The ceramic powder is preferably at least one ceramic powder selected from the group consisting of alumina, mullite, cordierite, forsterite and celsian. It is more preferred to contain an alumina powder. Typically, the ceramic powder is an alumina powder.

The low dielectric constant composition in the first method consists essentially of the above-described components, but may contain other components within a range not to impair the purpose of the present invention. In such a case, their total content is preferably at most 20%, more preferably at most 10%.

The low dielectric constant composition is one which precipitates crystals when fired at a temperature of from 850 to 900° C. thereby to increase the strength of the fired body. Usually, crystals will be precipitated in the above-described glass powder.

If the difference obtained by subtracting from the amount of $SiO_2+Al_2O_3$ in the glass powder for low dielectric constant in the low dielectric constant raw material layer the amount of $SiO_2+Al_2O_3$ in the glass powder for high dielectric constant in the high dielectric constant raw material layer adjacent to the low dielectric constant raw material layer, is less than 9 mol %, it will be difficult to make the difference obtained by subtracting from Ts of the glass powder for low dielectric constant Ts of the glass powder for high dielectric constant to be at least 70° C. The difference between the two is typically at least 11 mol %.

Further, if the difference obtained by subtracting from the amount of $B_2O_3+BaO+ZnO$ in the glass powder in the high dielectric constant glass ceramic composition of the high dielectric constant raw material layer the amount of $B_2O_3+BaO+ZnO$ in the glass powder in the low dielectric constant glass ceramic composition of the low dielectric constant raw material layer adjacent to the high dielectric constant raw material layer, is less than 30 mol %, it will be difficult to make the difference obtained by subtracting from Ts of the glass powder in the high dielectric constant raw material layer Ts of the glass powder in the low dielectric constant raw material layer to be at least 110° C. The difference between the two is typically at least 33 mol %.

Now, the composition of the low dielectric constant composition in the second and third methods will be described by the mass percentage representation.

The glass powder for low dielectric constant is essential as a component to increase the densification of the fired body.

If its content is less then 30%, a dense fired body tends to be hardly obtainable, and it is preferably at least 40%, more preferably at least 50%, typically at least 60%. If it exceeds 90%, the strength of the fired body tends to deteriorate, and it is preferably at most 85%, more preferably at most 80%.

$D_{50}$ of the glass powder for low dielectric constant is preferably from 0.5 to 20 μm. If $D_{50}$ is less than 0.5 μm, for example, it tends to be difficult to uniformly disperse the glass powder in the green sheet, and it is preferably at least 1 μm, particularly preferably at least 2 μm. If it exceeds 20 μm, a dense fired body tends to be hardly obtainable, and it is more preferably at most 15 μm, further preferably at most 7 μm, particularly preferably at most 5 μm.

Ts of the glass powder for low dielectric constant is preferably higher by at least 70° C., more preferably higher by at least 110° C., than Ts for the glass powder for high dielectric constant in the high dielectric constant composition contained in the high dielectric constant raw material layer adjacent to the low dielectric constant raw material layer containing the low dielectric constant composition.

The present inventors have studied thermal shrinkage curves of green sheets containing various glass powders and have found that the above-mentioned shrinkage during the firing can easily be reduced when Ts of the above-mentioned two glass powders would satisfy the above relation. Namely, in a case where Ts of the two glass powders satisfy the above relation, softening shrinkage starts in the high dielectric constant raw material layer prior to the low dielectric constant raw material layer during the firing, and yet, when the shrinkage reaches 50%, softening shrinkage of the low dielectric constant raw material layer will start in many cases. In such a case, the adjacent high dielectric constant raw material layer has become considerably dense by that time, and it is considered that softening shrinkage of the low dielectric constant raw material layer will be suppressed by such a dense high dielectric constant raw material layer, whereby the shrinkage during the firing can be reduced.

In a case where it is desired to certainly reduce the shrinkage, it is more preferred that Ts of the glass powder for low dielectric constant is higher by at least 110° C. than Ts of the glass powder for high dielectric constant.

Ts of the glass powder for low dielectric constant is preferably at most 910° C. If Ts exceeds 910° C., a dense fired body may not be obtained when firing is carried out at a temperature of at most 900° C., and it is typically at least 800° C.

Tg of the glass powder for low dielectric constant is typically from 650 to 750° C.

In a fired body obtained by firing the glass powder for low dielectric constant, typically in a fired body obtained by firing at 860° C., 880° C. or 900° C., it is preferred that at least one type of crystals selected from the group consisting of forsterite, enstatite, diopside and anorthite, are precipitated. Otherwise, the strength of the fired body is likely to be low, or tan δ of the fired body is likely to be large.

The glass powder for low dielectric constant consists essentially of, as represented by mol % based on the following oxides, from 35 to 55% of $SiO_2$, from 0 to 5% of $B_2O_3$, from 5 to 20% of $Al_2O_3$, from 20 to 40% of MgO, from 0 to 20% of CaO, from 0 to 10% of BaO, from 0 to 10% of ZnO, and from 0 to 10% of $TiO_2+ZrO_2+SnO_2$, wherein $SiO_2+Al_2O_3$ is preferably from 45 to 75 mol %.

The composition of this preferred embodiment of the glass powder for low dielectric constant will be described, wherein mol % will be represented simply by %.

$SiO_2$ is a network former for the glass and is essential. If $SiO_2$ is less than 35%, it tends to be difficult to obtain stable glass, or the stability of glass tends to be inadequate, and a reaction is likely to take place at the interface with the high dielectric constant layer or the high dielectric constant glass ceramic composition, and it is preferably at least 40%, more preferably at least 42%. If it exceeds 55%, Ts or Tg tends to be too high, and it is preferably at most 52%.

$B_2O_3$ is not essential, but may be incorporated up to 5% in order to e.g. stabilize the glass. If $B_2O_3$ exceeds 5%, tan δ of the fired body tends to be large, or the chemical durability tends to deteriorate.

$Al_2O_3$ is essential as a component to increase the stability or chemical durability of the glass. If $Al_2O_3$ is less than 5%, the glass tends to be unstable, and it is preferably at least 6%. If it exceeds 20%, Ts or Tg tends to be too high, and it is preferably at most 10%, more preferably at most 8.5%.

If the total content of $SiO_2$ and $Al_2O_3$ is less than 45%, Ts tends to be too low, whereby the dimensional precision of the fired body tends to deteriorate, and it is preferably at least 48%. If the total content exceeds 75%, Ts tends to be high, whereby it tends to be difficult to obtain a dense fired body when firing is carried out at a temperature of at most 900° C., and it is preferably at most 66%.

MgO has an effect to stabilize the glass or to accelerate precipitation of crystals from the glass and is essential. If MgO is less than 20%, such an effect tends to be inadequate, and it is preferably at least 25%. If it exceeds 40%, the glass tends to be unstable, and it is preferably at most 38%.

CaO is not essential, but may be incorporated up to 20% in order to e.g. stabilize the glass or lower tan δ of the fired body. Further, it is a constituting component of diopside and anorthite, and in a case where it is desired to precipitate such crystals, its content is preferably at least 5%, more preferably at least 7%. In a case where it is desired to precipitate anorthite, CaO is incorporated particularly preferably in an amount of at least 14%. If CaO exceeds 20%, the glass is likely to be unstable, and it is preferably at most 18%. In a case where it is not desired to precipitate anorthite, CaO is preferably at most 12%.

BaO is not essential, but may be incorporated up to 10% in order to e.g. stabilize the glass. If BaO exceeds 10%, tan δ of the fired body is likely to be large.

ZnO is not essential, but may be incorporated up to is 10% in order to e.g. lower Ts or Tg. If ZnO exceeds 10%, the chemical durability, particularly the acid resistance, of the glass tends to deteriorate, and it is preferably at most 8%. In a case where ZnO is incorporated, its content is preferably at least 2%, typically at least 5%.

Each of $TiO_2$, $ZrO_2$ and $SnO_2$ is not essential, but they may be contained up to 10% in total in order to e.g. increase the chemical durability of the glass or increase the crystallinity of the fired body. If the total content of these components exceeds 10%, Ts tends to be too high, or the densification of the fired body is likely to be low.

It is preferred that $SiO_2$ is from 40 to 55%, $Al_2O_3$ from 5 to 10%, MgO from 28 to 40%, CaO from 0 to 18%, and $SnO_2$ from 0 to 5%.

This glass powder for low dielectric constant consists essentially of the above-described components, but may contain other components within a range not to impair the purpose of the present invention. For example, for the purpose of e.g. lowering the glass melting temperature, $P_2O_5$ or the like may be incorporated, and for the purpose of e.g. coloring the glass or increasing the crystallinity, CuO, CoO, $CeO_2$, $Y_2O_3$, $La_2O_3$, $Nd_2O_3$, $Sm_2O_3$, $Bi_2O_3$ or $WO_3$ may, for example, be incorporated.

In a case where such other components are incorporated, their total content is preferably at most 10%. Further, neither alkali metal oxides nor PbO may be incorporated.

The ceramic powder as another essential component for the low dielectric constant composition in the second and third methods, is essential as a component to e.g. increase the strength of the fired body or adjust α of the fired body thereby to reduce the difference from α in the adjacent high dielectric constant layer.

If the content of the ceramic powder is less than 10%, the strength of the fired body is likely to be low, and it is typically at least 15%. If it exceeds 70%, a dense fired body tends to be hardly obtainable, and it is typically at most 45%.

$D_{50}$ of the ceramic powder is preferably from 1 to 12 µm. If $D_{50}$ is less than 1 µm, for example, it tends to be difficult to uniformly disperse it in the green sheet, and it is more preferably at least 1.5 µm. If it exceeds 12 µm, a dense fired body tends to be hardly obtainable, and it is more preferably at most 5 µm, particularly preferably at most 3.5 µm.

The ceramic powder is preferably at least one type of ceramic powder selected from the group consisting of alumina, mullite, cordierite, forsterite and celsian, and it is more preferred to contain an alumina powder. Typically, the ceramic powder is an alumina powder.

The low dielectric constant composition in the second and third methods consists essentially of the above-described components, but may contain other components within a range not to impair the purpose of the present invention. In such a case, their total content is preferably at most 20%, more preferably at most 10%. This low dielectric constant composition is preferably one which precipitates crystals when fired at a temperature of from 850 to 900° C. in order to increase the strength of the fired body. In such a case, crystals are usually precipitated in the above-described glass powder.

In the second and third methods, if the difference obtained by subtracting from the amount of $SiO_2+Al_2O_3$ in the glass powder for low dielectric constant in the low dielectric constant raw material layer the amount of $SiO_2+Al_2O_3$ in the glass powder for high dielectric constant in the high dielectric constant raw material layer adjacent to the low dielectric constant raw material layer, is less than 9 mol %, it will be difficult to make the difference obtained by subtracting from Ts of the glass powder for low dielectric constant Ts of the glass for high dielectric constant to be at least 70° C. The difference between the two is typically at least 11 mol %.

Further, the difference obtained by subtracting from the amount of $B_2O_3+BaO+ZnO$ in the glass powder in the high dielectric constant glass ceramic composition of the high dielectric constant raw material layer the amount of $B_2O_3+BaO+ZnO$ in the glass powder in the low dielectric constant glass ceramic composition of the low dielectric constant raw material layer adjacent to the high dielectric constant raw material layer, is preferably at least 30 mol %. If the difference between the two is less than 30 mol %, it tends to be difficult to make the difference in Ts between the two to be at least 110° C.

EXAMPLES

Raw materials were prepared and mixed so that the composition would be as shown by mol % in lines for from "$SiO_2$" to "$SnO_2$" in Table 1, and the mixed raw materials were put into a platinum crucible and melted at a temperature of from 1,550 to 1,600° C. for 60 minutes. Then, the molten glass was discharged and cooled. The obtained glass was pulverized for from 20 to 60 hours by an alumina ball mill using ethyl alcohol as a solvent. In this manner, glass powders G1 to G6 were obtained. G1 and G5 are glass powders for high dielectric constant, and G2 and G3 are glass powders for low dielectric constant.

Here, melting of G4 was carried out at 1,650° C. for 60 minutes, and in the Table, Si+Al represents $SiO_2+Al_3O_3$ and B+Ba+Zn represents $B_2O_3+BaO+ZnO$.

$D_{50}$ (unit: µm) of each glass powder was measured by means of laser diffraction type particle size analyzer (SALD2100, manufactured by Shimadzu Corporation), and Tg (unit: ° C.), Ts (unit: ° C.) and the crystallization peak temperature Tc (unit: ° C.) were measured by means of a thermal analyzer (TG-DTA2000, manufactured by Mac-Science) by raising the temperature to 1,000° C. at a heating rate of 10° C./min. Here, Ts of G4 was not measured by this method, and no crystallization peak of G4 was observed up to 1,000° C.

Further, with respect to a fired body obtained by maintaining (firing) each glass powder at 900° C. for two hours, the presence or absence of precipitation of crystals was examined by the X-ray diffraction method, whereby celsian crystals were observed in the fired body of G1, forsterite crystals, diopside crystals and anorthite crystals were observed in the fired body of G2, forsterite crystals and enstatite crystals were observed in the fired body of G3, barium aluminosilicate and barium aluminosilicate crystals were observed in the fired body of G5, and $Ba_2Ti_9O_{20}$ crystals were observed in the fired body of G6. On the other hand, no precipitation of crystals were observed in the fired body of G4.

TABLE 1

|  | G1 | G2 | G3 | G4 | G5 | G6 |
|---|---|---|---|---|---|---|
| $SiO_2$ | 31.7 | 44.0 | 50.0 | 65.0 | 30.5 | 38.0 |
| $B_2O_3$ | 21.5 | 0 | 0 | 25.0 | 17.0 | 9.0 |
| $Al_2O_3$ | 6.5 | 7.8 | 7.5 | 5.0 | 6.0 | 3.0 |
| CaO | 7.4 | 16.0 | 0 | 5.0 | 7.0 | 4.5 |

TABLE 1-continued

|  | G1 | G2 | G3 | G4 | G5 | G6 |
|---|---|---|---|---|---|---|
| MgO | 0 | 29.8 | 35.0 | 0 | 4.5 | 0 |
| BaO | 14.7 | 0 | 0 | 0 | 14.0 | 15.0 |
| ZnO | 15.4 | 2.4 | 7.5 | 0 | 14.0 | 0 |
| $TiO_2$ | 0 | 0 | 0 | 0 | 7.0 | 23.0 |
| $ZrO_2$ | 2.0 | 0 | 0 | 0 | 0 | 0 |
| $SnO_2$ | 0.6 | 0 | 0 | 0 | 0 | 0 |
| Si + Al | 38.2 | 51.8 | 57.5 | 70.0 | 36.5 | 41.0 |
| B + Ba + Zn | 51.6 | 2.4 | 7.5 | 25.0 | 45.0 | 24.0 |
| Tg | 603 | 720 | 733 | 617 | 600 | 670 |
| Ts | 722 | 872 | 904 | — | 722 | 798 |
| Tc | 800 | 948 | 953 | — | 820 | 848 |
| $D_{50}$ | 3.6 | 3.5 | 2.2 | 2.8 | 2.2 | 1.9 |

On the other hand, a BT powder was prepared as follows. Namely, 88 g of $BaCO_3$ powder (barium carbonate BW-KT, manufactured by Sakai Chemical Industry) and 130 g of $TiO_2$ powder (rutile type reagent, manufactured by Kanto Chemical) were mixed by a ball mill using water as a solvent, then dried and maintained at 1,150° C. for two hours. Then, pulverization was carried out by a ball mill for 60 hours to obtain a powder having $D_{50}$ of 0.9 μm. With respect to this powder, the X-ray diffraction measurement was carried out, whereby a strong diffraction peak pattern of $BaTi_4O_9$ crystals was observed.

Glass ceramic compositions GC1A to GC6 having the compositions shown by mass percentage in lines for from "Glass" to "Titanium oxide" in Table 2, were prepared. The glass used is shown in the line for "Type of glass".

GC1A and GC5 are high dielectric constant glass ceramic compositions of the present invention, and GC1B, GC2 and GC3 are low dielectric constant glass ceramic compositions of the present invention.

As the alumina powder, Sumicorundum AA2 ($D_{50}$=2.0 μm) manufactured by Sumitomo Chemical was used; as the magnesium titanate powder, MT ($D_{50}$=0.8 μm, composition: $Mg_2TiO_4$, the X-ray diffraction pattern shows diffraction peaks of MgO crystals and $MgTiO_3$ crystals) manufactured by Fuji Titanium Industry was used; and as the titanium oxide powder, HT0210 ($D_{50}$=1.8 μm) manufactured by Toho Titanium was used.

7 g of each of GC1A to GC4 was press-molded by means of a mold and held at 860° C. for one hour for firing to obtain a fired body, which was subjected to grinding to obtain a rod-shaped sample having diameter of 5 mm and a length of 20 mm. Using this sample, the above-mentioned α (unit: ×$10^{-7}$/° C.) was measured by means of a differential thermal expansion meter DILATOMETER, manufactured by Mac-Science. The results are shown in Table 2.

Further, 3 g of GC1A was press-molded by means of a cylindrical mold and fired in the same manner to obtain a fired body, which was subjected to polishing to obtain a cylindrical sample having a diameter of 4.2 mm and a thickness of 3.1 mm. Using this sample, $\in$ and tan δ at 20 GHz were measured by means of a network analyzer and a parallel conductor resonance dielectric constant measuring system, manufactured by Keycom. The results are shown in lines for "$\in$(20 G/25 G)" and "tan δ(20 G/25 G)".

5 g of the powder of each of GC1A, GC5 and GC6 was press-molded by means of another mold and fired in the same manner to obtain a fired body, which was subjected to polishing to obtain a cylindrical sample having a diameter of 14 mm and a height of 8 mm. Using this sample, $\in$ and tan δ at 6 GHz were measured by means of a network analyzer and the above-mentioned parallel flat conductor panel resonance dielectric constant measuring system. The results are shown in lines for "$\in$ (6 G)" and "tan δ (6 G)".

Further, with respect to GC1A, four cylindrical samples were prepared in the same manner so that the diameter and the height were 13.8 mm and 14.0 mm, 13.8 mm and 6.9 mm, 13.8 mm and 3.4 mm, and 4.3 mm and 3.2 mm, respectively, and in the same manner as the above-mentioned measurements of $\in$ and tan δ at 6 GHz, $\in$ and tan δ were measured at 5 GHz, 7 GHz, 11 GHz and 19 GHz. At the frequencies in this order, $\in$ was 19.8, 20.3, 20.0 and 20.4, respectively, and tanδ was 0.0021, 0.0024, 0.0028 and 0.0032, respectively. Further, also as shown in Table 2, $\in$ at 6 GHz and 20 GHz was 20.9 and 21.6, respectively. From this, it is evident that the frequency dependency of $\in$ at from 5 GHz to 19 GHz is small.

To 50 g of GC1A, 15 g of an organic solvent (one having toluene, xylene, 2-propanol and 2-butanol mixed in a mass ratio of 4:2:2:1), 2.5 g of a plasticizer (di-2-ethylhexyl phthalate), 5 g of a resin (polyvinyl butyral PVK#3000K, manufactured by Denki Kagaku Kogyo K.K.) and a dispersant (BYK180) were mixed to obtain a slurry. This slurry was applied on a PET film by a doctor blade method and dried to obtain a green sheet S1A having a thickness of 0.2 mm. Further, by using GC1B to GC4, green sheets S1B to S4 were prepared in the same manner.

$\in$ and tan δ of fired bodies obtainable by firing GC1B to GC4 were measured as follows. Namely, S1B and S4 were cut into 50 mm×50 mm, and six sheets each were laminated and pressed under 15 MPa for one minute. This pressed product was maintained at 550° C. for 5 hours to decompose and remove the resin component and then maintained at 860° C. for one hour for firing to obtain a fired body. Both the upper and lower surfaces of the obtained fired body was mirror-polished to obtain a sample having a thickness of 250 μm. With respect to this sample, $\in$ and tan δ at 25 GHz were measured by the network analyzer 8722ES, manufactured by Agilent Technology and by a cavity resonance method using a 25 GHz cavity resonator. The results are shown in lines for "$\in$ (20 G/25 G)" and "tan δ (20 G/25 G)" in Table 2.

Further, each of glass ceramic compositions GC1A to GC4 was maintained at 900° C. for two hours, and crystals present in the obtained fired body were examined by the X-ray diffraction method, whereby as crystals other than the crystals present in each glass ceramic composition, presence of celsian and hexacelsian was observed in the fired body of GC1A, presence of celsian, hexacelsian and gahnite was observed in the fired body of GC1B, presence of forsterite, diopside and anorthite was observed in the fired body of GC2, and presence of enstatite and forsterite was observed in the fired body of GC3. In the fired body of GC4, no crystals other than the crystals present in the glass ceramic composition were observed.

TABLE 2

|  | GC1A | GC1B | GC2 | GC3 | GC4 | GC5 | GC6 |
|---|---|---|---|---|---|---|---|
| Type of glass | G1 | G1 | G2 | G3 | G4 | G5 | G6 |
| Glass | 38 | 45 | 65 | 75 | 50 | 42 | 50 |

TABLE 2-continued

|  | GC1A | GC1B | GC2 | GC3 | GC4 | GC5 | GC6 |
|---|---|---|---|---|---|---|---|
| Alumina | 0 | 55 | 35 | 25 | 50 | 0 | 0 |
| Magnesium titanate | 2 | 0 | 0 | 0 | 0 | 0 | 0 |
| BT | 58 | 0 | 0 | 0 | 0 | 56 | 50 |
| Titanium oxide | 2 | 0 | 0 | 0 | 0 | 2 | 0 |
| α | 81 | 60 | 78 | 84 | 55 | 79 | 78 |
| ε (20 G/25 G) | 21.6 | 7.6 | 8.2 | 6.1 | 5.1 | — | — |
| ε (6 G) | 20.9 | — | — | — | — | 19.7 | 18.0 |
| tanδ (20 G/25 G) | 0.0035 | 0.0019 | 0.0018 | 0.0031 | 0.0014 | — | — |
| tanδ (6 G) | 0.0023 | — | — | — | — | 0.0021 | 0.0024 |

Example 1

S1A and S2 were, respectively, cut into a size of 40 mm×40 mm, and a total of 8 green sheets i.e. 2 sheets of S2, 4 sheets of S1 and 2 sheets of S2, were laminated. One having 2 sheets of S2 laminated constitutes a low dielectric constant raw material layer, and one having 4 sheets of S1 laminated constitutes a high dielectric constant raw material layer. Namely, the one having 8 green sheets laminated is a raw material layer laminate having a total of three layers laminated in the order of the low dielectric constant raw material layer (first layer), the high dielectric constant raw material layer (second layer) and the low dielectric constant raw material layer (third layer).

Then, this raw material layer laminate was pressed under 10 MPa for one minute. In the obtained pressed product, four holes were punched out to form apexes of a square of 30 mm×30 mm, and then the product was maintained at 550° C. for 5 hours to decompose and remove the resin component and then maintained at 860° C. for one hour to carry out firing to obtain a fired body. The length of one side of the square formed by the punched holes in the fired body was measured under a microscope, and the shrinkage (unit: %) was calculated. This shrinkage is desired to be at most 5%.

In lines for from "First layer" to "Third layer" in Table 3, the glass ceramic compositions of the respective layers are shown; in the line for "$\Delta_{Si+Al}$" (unit: mol %), the difference obtained by subtracting from the amount of $SiO_2+Al_2O_3$ (this is equal to $SiO_2+Al_2O_3$ in the third layer) in the glass powder in the glass ceramic composition of the first layer the amount of $SiO_2+Al_2O_3$ in the glass powder in the glass ceramic composition of the second layer, is shown; and in the line for "$\Delta\alpha$" (unit: ×$10^{-7}$/° C.), the absolute value of the difference between α (this is equal to α of the fired body of the glass ceramic composition of the third layer) of the fired body of the glass ceramic composition of the first layer and the α of the fired body of the glass ceramic composition of the second layer, is shown. This Example is an example of the present invention.

Further, avoiding the hole portions, the fired body was cut to obtain a plate sample of 4 mm×20 mm, and the side surface was subjected to #1000 polishing, whereupon the three point flexural strength (unit: MPa) was measured under such conditions that the span was 15 mm, and the crosshead speed was 0.5 mm/min. An average value of the strength obtained with respect to five plate samples is shown in the line for "Strength" in Table 3. This average value is desired to be at least 200 MPa.

Examples 2 to 7

Fired bodies were prepared and Δα, the shrinkage and the strength were measured, in the same manner as in Example 1 except that the glass ceramic compositions of the first to third layers were as shown in Table 3. For example, in Example 2, S3 was used for forming the first and third layers, and S1A was used for forming the second layer.

Examples 2 and 6 are examples of the present invention, and Examples 3 to 5 and 7 are comparative examples.

TABLE 3

|  | Ex. 1 | Ex. 2 | Ex. 3 | Ex. 4 | Ex. 5 | Ex. 6 | Ex. 7 |
|---|---|---|---|---|---|---|---|
| First layer | GC2 | GC3 | GC1B | GC4 | GC1A | GC3 | GC3 |
| Second layer | GC1A | GC1A | GC1A | GC1A | GC1A | GC5 | GC6 |
| Third layer | GC2 | GC3 | GC1B | GC4 | GC1A | GC3 | GC3 |
| $\Delta_{Si+Al}$ | 13.6 | 19.3 | 0 | 31.8 | 0 | 21.0 | 16.5 |
| $\Delta_{B+Ba+Zn}$ | 49.2 | 44.1 | 0 | 26.6 | 0 | 37.5 | 16.5 |
| Δα | 3 | 3 | 21 | 26 | 0 | 5 | 6 |
| Shrinkage | 4.0 | 3.9 | 8.2 | 8.8 | 9.8 | 2.8 | 10.8 |
| Strength | 250 | 280 | 120 | 20 | 140 | 250 | 260 |

The entire disclosure of Japanese Patent Application No. 2004-137579 filed on May 6, 2004 including specification, claims, and summary is incorporated herein by reference in its entirety.

What is claimed is:

1. A method for producing a laminated dielectric having a low dielectric constant layer and a high dielectric constant layer alternately laminated in an odd number of layers in total so that a low dielectric constant layer constitutes the outermost layer, which comprises alternately laminating a high dielectric constant raw material layer containing a high dielectric constant glass ceramic composition, to form a high dielectric constant layer having a relative dielectric constant of from 16 to 30 at a frequency of from 1 GHz to 25 GHz, when fired, and a low dielectric constant raw material layer containing a low dielectric constant glass ceramic composition, to form a low dielectric constant layer having a relative dielectric constant of at least 5 at the above frequency, which is smaller by at least 3 than the relative dielectric constant of a high dielectric constant layer adjacent thereto, when fired, in an odd number of layers in total so that a low dielectric constant raw material layer constitutes the outermost layer, followed by firing, wherein:

the high dielectric constant glass ceramic composition consists essentially of, as represented by mass percentage, from 30 to 70% of a ceramic powder and from 30 to 70% of a glass powder containing $SiO_2$ and $Al_2O_3$ in an amount of $SiO_2+Al_2O_3$ being from 25 to 50 mol % and further containing at least one of $B_2O_3$, BaO and ZnO and not containing lead and alkali metals, and is one which precipitates crystals when fired at a temperature of from 850 to 900° C.;

the low dielectric constant glass ceramic composition consists essentially of, as represented by mass percentage, from 10 to 70% of a ceramic powder and from 30 to 90% of a glass powder containing $SiO_2$ and $Al_2O_3$ in an amount of $SiO_2+Al_2O_3$ being at least 34 mol % and not containing lead and alkali metals, and is one which precipitates crystals when fired at a temperature of from 850 to 900° C.;

the difference obtained by subtracting from the amount of $SiO_2+Al_2O_3$ in the glass powder in the low dielectric constant glass ceramic composition of the low dielectric constant raw material layer the amount of $SiO_2+Al_2O_3$ in the glass powder in the high dielectric constant glass ceramic composition of the high dielectric constant raw material layer adjacent to the low dielectric constant raw material layer, is at least 9 mol %; and the difference obtained by subtracting from the amount of $B_2O_3+BaO+ZnO$ in the glass powder in the high dielectric constant glass ceramic composition of the high dielectric constant raw material layer the amount of $B_2O_3+BaO+ZnO$ in the glass powder in the low dielectric constant glass ceramic composition of the low dielectric constant raw material layer adjacent to the high dielectric constant raw material layer, is at least 30 mol %.

2. The method for producing a laminated dielectric according to claim 1, wherein the difference obtained by subtracting from a softening point of the glass powder in the low dielectric constant glass ceramic composition a softening point of the glass powder in the high dielectric constant glass ceramic composition is at least 70° C.

3. A method for producing a laminated dielectric having a low dielectric constant layer and a high dielectric constant layer alternately laminated in an odd number of layers in total so that a low dielectric constant layer constitutes the outermost layer, which comprises alternately laminating a high dielectric constant raw material layer containing a high dielectric constant glass ceramic composition, to form a high dielectric constant layer having a relative dielectric constant of from 16 to 30 at a frequency of from 1 GHz to 25 GHz, when fired, and a low dielectric constant raw material layer containing a low dielectric constant glass ceramic composition, to form a low dielectric constant layer having a relative dielectric constant of at least 5 at the above frequency, which is smaller by at least 3 than the relative dielectric constant of a high dielectric constant layer adjacent thereto, when fired, in an odd number of layers in total so that a low dielectric constant raw material layer constitutes the outermost layer, followed by firing, wherein:

the high dielectric constant glass ceramic composition consists essentially of as represented by mass percentage, from 30 to 70% of a Ba—Ti compound powder containing Ba and Ti in a Ti/Ba molar ratio of from 3.0 to 5.7, and from 30 to 70% of a glass powder consisting essentially of, as represented by mol % of the following oxides, from 15 to 40% of $SiO_2$, from 5 to 37% of $B_2O_3$, from 2 to 15% of $Al_2O_3$, from 1 to 25% of CaO+SrO, from 5 to 25% of BaO, from 0 to 35% of ZnO and from 0 to 10% of $TiO_2+ZrO_2+SnO_2$, $SiO_2+A_2O_3$ being from 25 to 50 mol %, $B_2O_3+ZnO$ being from 15 to 45 mol % and not containing lead and alkali metals;

the low dielectric constant glass ceramic composition consists essentially of, as represented by mass percentage, from 10 to 70% of a ceramic powder and from 30 to 90% of a glass powder containing $SiO_2$ and $Al_2O_3$ in an amount of $SiO_2+Al_2O_3$ being at least 34 mol %, not containing $B_2O_3$ or containing $B_2O_3$ within a range of at most 22 mol % and not containing lead and alkali metals;

the difference obtained by subtracting from the amount of $SiO_2+Al_2O_3$ in the glass powder in the low dielectric constant glass ceramic composition of the low dielectric constant raw material layer the amount of $SiO_2+Al_2O_3$ in the glass powder in the high dielectric constant glass ceramic composition of the high dielectric constant raw material layer adjacent to the low dielectric constant raw material layer, is at least 9 mol %; and the difference obtained by subtracting from a softening point of the glass powder in the low dielectric constant glass ceramic composition a softening point of the glass powder in the high dielectric constant glass ceramic composition is at least 70° C.

4. The method for producing a laminated dielectric according to claim 3, wherein the glass powder in the high dielectric constant glass ceramic composition is one which precipitates crystals when it is fired at the same temperature as the temperature for firing the layers alternately laminated in an odd number of layers so that a low dielectric constant raw material layer constitutes the outermost layer.

5. The method for producing a laminated dielectric according to claim 3, wherein the high dielectric constant glass ceramic composition contains at least one type of crystal powder selected from the group consisting of MgO, $MgTiO_3$, $CaTiO_3$, $SrTiO_3$ and $TiO_2$ in a total amount of from 0.1 to 10 mass %.

6. The method for producing a laminated dielectric according to claim 3, wherein the glass powder in the low dielectric constant glass ceramic composition consists essentially of, as represented by mol % of the following oxides, from 35 to 55% of $SiO_2$, from 0 to 5% of $B_2O_3$, from 5 to 20% of $Al_2O_3$, from 20 to 40% of MgO, from 0 to 20% of CaO, from 0 to 10% of BaO, from 0 to 10% of ZnO and from 0 to 10% of $TiO_2+ZrO_2+SnO_2$, provided that $SiO_2+Al_2O_3$ is from 45 to 75 mol %.

7. The method for producing a laminated dielectric according to claim 6, wherein the glass powder in the low dielectric constant glass ceramic composition contains, as represented by mol %, from 40 to 55% of $SiO_2$, from 5 to 10% of $Al_2O_3$, from 28 to 40% of MgO, from 0 to 18% of CaO and from 0 to 5% of $SnO_2$.

8. The method for producing a laminated dielectric according to claim 3, wherein the glass powder in the low dielectric constant glass ceramic composition is one which precipitates crystals when it is fired at the same temperature as the temperature for firing the layers alternately laminated in an odd number of layers so that a low dielectric constant raw material layer constitutes the outermost layer.

9. The method for producing a laminated dielectric according to claim 3, wherein the difference obtained by subtracting from the amount of $B_2O_3+BaO+ZnO$ in the glass powder in the high dielectric constant glass ceramic composition of the high dielectric constant raw material layer the amount of $B_2O_3+BaO+ZnO$ in the glass powder in the low dielectric constant glass ceramic composition of the low dielectric constant raw material layer adjacent to the high dielectric constant raw material layer, is at least 30 mol %.

10. The method for producing a laminated dielectric according to claim 3, wherein the ceramic powder in the low dielectric constant glass ceramic composition is at least one type of ceramic powder selected from the group consisting of alumina, mullite, cordierite, forsterite and celsian.

11. The method for producing a laminated dielectric according to claim 3, wherein the Ti/Ba molar ratio is from 3.5 to 5.0.

12. The method for producing a laminated dielectric according to claim 3, wherein the Ba—Ti compound powder contains $BaTi_4O_9$ crystals.

13. The method for producing a laminated dielectric according to claim 3, wherein the absolute value of the difference in the average linear expansion coefficient within from 50 to 350° C. between the high dielectric constant layer and the low dielectric constant layer adjacent in the laminated dielectric, is at most $20 \times 10^{-7}/°C$.

14. The method for producing a laminated dielectric according to claim 3, wherein the thicknesses of layers symmetrically located from the center layer are equal to each other.

15. A method for producing a laminated dielectric having a low dielectric constant layer and a high dielectric constant layer alternately laminated in an odd number of layers in total so that a low dielectric constant layer constitutes the outermost layer, which comprises alternately laminating a high dielectric constant raw material layer containing a high dielectric constant glass ceramic composition, to form a high dielectric constant layer having a relative dielectric constant of from 16 to 30 at a frequency of from 1 GHz to 25 GHz, when fired, and a low dielectric constant raw material layer containing a low dielectric constant glass ceramic composition, to form a low dielectric constant layer having a relative dielectric constant of at least 5 at the above frequency, which is smaller by at least 3 than the relative dielectric constant of a high dielectric constant layer adjacent thereto, when fired, in an odd number of layers in total so that a low dielectric constant raw material layer constitutes the outermost layer, followed by firing, wherein:

the high dielectric constant glass ceramic composition consists essentially of, as represented by mass percentage, from 30 to 70% of a Ba—Ti compound powder containing Ba and Ti in a Ti/Ba molar ratio of from 3.0 to 5.7, and from 30 to 70% of a glass powder consisting essentially of, as represented by mol % of the following oxides, from 15 to 40% of $SiO_2$, from 5 to 37% of $B_2O_3$, from 2 to 15% of $Al_2O_3$, from 1 to 25% of MgO+CaO+SrO, from 0 to 7% of MgO, from 5 to 25% of BaO, from 0 to 35% of ZnO and from 0 to 10% of $TiO_2+ZrO_2+SnO_2$, $SiO_2+Al_2O_3$ being from 25 to 50 mol %, $B_2O_3+ZnO$ being from 15 to 45 mol % and not containing lead and alkali metals;

the low dielectric constant glass ceramic composition consists essentially of, as represented by mass percentage, from 10 to 70% of a ceramic powder and from 30 to 90% of a glass powder containing $SiO_2$ and $Al_2O_3$ in an amount of $SiO_2+Al_2O_3$ being at least 34 mol %, not containing $B_2O_3$ or containing $B_2O_3$ within a range of at most 22 mol % and not containing lead and alkali metals;

the difference obtained by subtracting from the amount of $SiO_2+Al_2O_3$ in the glass powder in the low dielectric constant glass ceramic composition of the low dielectric constant raw material layer the amount of $SiO_2+Al_2O_3$ in the glass powder in the high dielectric constant glass ceramic composition of the high dielectric constant raw material layer adjacent to the low dielectric constant raw material layer, is at least 9 mol %; and the difference obtained by subtracting from a softening point of the glass powder in the low dielectric constant glass ceramic composition a softening point of the glass powder in the high dielectric constant glass ceramic composition is at least 70° C.

16. The method for producing a laminated dielectric according to claim 15, wherein the glass powder in the high dielectric constant glass ceramic composition contains, as represented by mol %, from 25 to 35% of $SiO_2$, from 5 to 22% of $B_2O_3$, from 2 to 10% of $Al_2O_3$, from 0 to 6% of MgO, from 0 to 10% of CaO, from 0 to 10% of SrO, from 7 to 22% of BaO, from 0 to 20% of ZnO, from 2 to 10% of $TiO_2$, from 0 to 8% of $ZrO_2$ and from 0 to 2% of $SnO_2$.

17. The method for producing a laminated dielectric according to claim 15, wherein the glass powder in the high dielectric constant glass ceramic composition is one which precipitates crystals when it is fired at the same temperature as the temperature for firing the layers alternately laminated in an odd number of layers so that a low dielectric constant raw material layer constitutes the outermost layer.

18. The method for producing a laminated dielectric according to claim 15, wherein the high dielectric constant glass ceramic composition contains at least one type of crystal powder selected from the group consisting of MgO, $MgTiO_3$, $CaTiO_3$, $SrTiO_3$ and $TiO_2$ in a total amount of from 0.1 to 10 mass %.

19. The method for producing a laminated dielectric according to claim 15, wherein the glass powder in the low dielectric constant glass ceramic composition consists essentially of, as represented by mol % of the following oxides, from 35 to 55% of $SiO_2$, from 0 to 5% of $B_2O_3$, from 5 to 20% of $Al_2O_3$, from 20 to 40% of MgO, from 0 to 20% of CaO, from 0 to 10% of BaO, from 0 to 10% of ZnO and from 0 to 10% of $TiO_2+ZrO_2+SnO_2$, provided that $SiO_2+Al_2O_3$ is from 45 to 75 mol %.

20. The method for producing a laminated dielectric according to 19, wherein the glass powder in the low dielectric constant glass ceramic composition contains, as represented by mol %, from 40 to 55% of $SiO_2$, from 5 to 10% of $Al_2O_3$, from 28 to 40% of MgO, from 0 to 18% of CaO and from 0 to 5% of $SnO_2$.

21. The method for producing a laminated dielectric according to claim 15, wherein the glass powder in the low dielectric constant glass ceramic composition is one which precipitates crystals when it is fired at the same temperature as the temperature for firing the layers alternately laminated in an odd number of layers so that a low dielectric constant raw material layer constitutes the outermost layer.

22. The method for producing a laminated dielectric according to claim 15, wherein the difference obtained by subtracting from the amount of $B_2O_3+BaO+ZnO$ in the glass powder in the high dielectric constant glass ceramic composition of the high dielectric constant raw material layer the amount of $B_2O_3+BaO+ZnO$ in the glass powder in the low dielectric constant glass ceramic composition of the low dielectric constant raw material layer adjacent to the high dielectric constant raw material layer, is at least 30 mol %.

23. The method for producing a laminated dielectric according to claim 15, wherein the ceramic powder in the low dielectric constant glass ceramic composition is at least one type of ceramic powder selected from the group consisting of alumina, mullite, cordiente, forsterite and celsian.

24. The method for producing a laminated dielectric according to claim 15, wherein the Ti/Ba molar ratio is from 3.5 to 5.0.

25. The method for producing a laminated dielectric according to claim 15, wherein the Ba—Ti compound powder contains $BaTi_4O_9$ crystals.

26. The method for producing a laminated dielectric according to claim 15, wherein the absolute value of the difference in the average linear expansion coefficient within from 50 to 350° C. between the high dielectric constant layer and the low dielectric constant layer adjacent in the laminated dielectric, is at most $20 \times 10^{-7}/°C$.

27. The method for producing a laminated dielectric according to claim 15, wherein the thicknesses of layers symmetrically located from the center layer are equal to each other.

* * * * *